United States Patent [19]

Bacon, Jr.

[11] Patent Number: 5,055,347
[45] Date of Patent: Oct. 8, 1991

[54] RETROREFLECTIVE SHEETING ADAPTED TO BE BONDED TO VULCANIZABLE OR CURABLE SUBSTRATE

[75] Inventor: Chester A. Bacon, Jr., Oakdale, Minn.

[73] Assignee: Minnesota Mining and Manufacturing Company, St. Paul, Minn.

[21] Appl. No.: 282,210

[22] Filed: Dec. 9, 1988

[51] Int. Cl.⁵ .................... B60C 13/00; G02B 5/128; B32B 25/02; D03D 15/08
[52] U.S. Cl. .................................. 428/250; 152/524; 152/525; 428/251; 428/252; 428/253; 428/285; 428/286; 428/287; 428/325; 428/913; 359/538
[58] Field of Search ............... 428/250, 251, 252, 253, 428/285, 286, 287, 325, 913; 152/523, 524, 525; 156/116, 121; 350/105

[56] References Cited

U.S. PATENT DOCUMENTS

| | | | |
|---|---|---|---|
| 3,382,908 | 5/1968 | Palmquist et al. | 152/353 |
| 3,449,201 | 6/1969 | Palmquist et al. | 161/164 |
| 3,452,799 | 7/1969 | Hindin et al. | 350/105 X |
| 3,608,044 | 9/1971 | Coplan et al. | 264/210 |
| 3,700,305 | 10/1972 | Bingham | 350/105 |
| 3,836,227 | 9/1974 | Holmen et al. | 350/105 |
| 4,299,874 | 11/1981 | Jones et al. | 428/143 |
| 4,803,117 | 2/1989 | Daponte | 428/228 |
| 4,849,265 | 7/1989 | Ueda et al. | 428/40 |

FOREIGN PATENT DOCUMENTS 788782 1/1958 United Kingdom ............... 350/105

Primary Examiner—George F. Lesmes
Assistant Examiner—Christopher Brown
Attorney, Agent, or Firm—Gary L. Griswold; Walter N. Kirn; Robert H. Jordan

[57] ABSTRACT

A retroreflective sheeting comprising a monolayer of retroreflective elements partially embedded in an elastomeric support layer and protruding from the front side of the support layer, and an omni-directionally elastic filamentary reinforcing web at least partially embedded in the rear portion of the support layer, wherein at least the back stratum of the support layer is a vulcanizable or curable elastomer. The back stratum comprises an elastomer which is compatible with the desired substrate. The reinforcing web is typically a knit or nonwoven web. The support layer may be monolayer, dual-layer or multi-layer.

23 Claims, 1 Drawing Sheet

RETROREFLECTIVE SHEETING ADAPTED TO BE BONDED TO VULCANIZABLE OR CURABLE SUBSTRATE

FIELD OF INVENTION

The present invention relates to retroreflective sheeting, particularly to a retroreflective sheeting which is adapted to be bonded to a vulcanizable or curable substrate.

BACKGROUND

Tires having retroreflective strips around their sidewalls, e.g., as disclosed in U.S. Pat. Nos. 3,382,908 (Palmquist et al.) and 3,449,201 (Palmquist et al.), have found acceptance, particularly for use on bicycles and motorcycles, to provide a measure of safety when the cycle is operated after dark. Such tires are typically constructed by adhering parallel strips of an uncured elastomer such as neoprene rubber supporting a layer of retroreflective elements to an unvulcanized tire casing. The tire casing is then vulcanized in a tire mold to form a completed tire having a U-shaped cross-section with the strips supporting the retroreflective elements forming a unified or integral part of the vulcanized tire casing.

Examples of strips useful for such purposes are disclosed in the aforementioned U.S. Pat. Nos. 3,382,908 and 3,449,201. These patents disclose thin sheet materials comprising an elastomeric support layer with a monolayer of retroreflective elements embedded therein, wherein the support layer or at least a back stratum thereof is a vulcanizable elastomer which is compatible with the elastomer of the tire side wall.

While such sheet material may achieve a strong bond to the tire side wall after vulcanization, due to their thin construction and narrow widths to which they are typically cut they may tend to stretch too easily and therefore be difficult to work with during fabrication of the tire. For instance, such sheet materials may tend to have such a low breaking force that they may easily break when subjected to the tensile forces encountered during fabrication, particularly after being cut into strip form, and even when they withstand such forces without breaking, the sheet materials may not be sufficiently elastic to substantially recover their original dimensions, thereby spoiling the final appearance on the tire.

SUMMARY OF INVENTION

The present invention provides a retroreflective sheeting which is adapted to be bonded to a vulcanizable or curable substrate. Such substrates may be omni-directionally elastic i.e., elastic in all directions, e.g., as are rubber tires, and are typically very flexible over broad temperature range, such as −40° F. (−40° C.) to 175° F. (80° C.) or more.

In brief summary, the retroreflective sheetings of the invention comprise a monolayer of retroreflective elements supported by and partially embedded in an elastomeric support layer and protruding from the front side of the support layer, and a reinforcing web of filaments at least partially embedded in the support layer. In some embodiments, the reinforcing web may protrude from the rear side of the support layer, and in other embodiments it may be substantially completely embedded therein. The reinforcing web is omni-directionally elastic and preferably has high porosity. Examples of webs useful as reinforcing webs in sheetings of the invention include, for instance, knit webs having an open mesh construction or nonwoven webs having a low density construction. By "omni-directionally elastic" it is meant that the article, e.g., reinforcing web, retroreflective sheeting, etc., when subjected to a tensile force can be stretched or extended and tends to return to substantially its original dimensions after release of the elongating tensile force in substantially every direction or orientation instead of only along specific directions or alignment. The support layer, or at least the back stratum thereof is a vulcanizable or curable elastomer which is compatible with the elastomer of the desired substrate, e.g., the side wall of a bicycle, motorcycle, or automobile tire. By "compatible" it is meant that when contacted to the substantially uncured substrate such as in a tire mold and subjected to appropriate conditions of heat and pressure for curing, the vulcanizable portion of the support layer will form a strong bond with the simultaneously curing substrate.

Application of such retroreflective sheetings to tires may be achieved by placing a piece of the sheeting of appropriate dimension on the proper location of the unvulcanized or green tire casing, and then putting this assembly in the tire mold. Alternatively, a piece of the sheeting of appropriate dimension may be placed in the mold in the proper location prior to inserting the green tire casing. When sufficient heat and pressure are applied in the tire mold to cure the vulcanizable portion of the sheeting and the tire casing, the sheeting will be embedded in the tire casing, with the vulcanizable portion of the binder layer vulcanizing with the elastomer of the tire sidewall such that the sheeting forms a substantially integral part of the tire sidewall. In embodiments where the reinforcing web protrudes from the rear side of the support layer, after curing of the sheeting and tire the web typically tends to reinforce the bond between the support layer of the sheeting and the tire side wall.

The omni-directionally elastic reinforcing web improves the handling characteristics of the sheeting by imparting greater strength to the retroreflective sheeting while maintaining the elasticity thereof. For instance, some embodiments of retroreflective sheetings of the invention may have a break force of about 2.5 pounds (11 Newtons) or more per 3/16 inch (4.8 millimeter) width. Accordingly, the sheeting is better able to withstand the tensile stresses to which it is typically subjected during its fabrication, any necessary conversion, e.g., cutting to strip form, and assembly with the tire carcass. Another advantage of such webs is that, because of the greater strength imparted to the sheeting, the support layer may be made in thinner form, thereby providing the opportunity for cost savings and overall reduced profile or thickness. In embodiments where the reinforcing web protrudes from the rear side of the support layer, the reinforcing web may also serve to facilitate positioning of the sheeting upon the green tire casing by providing means for a "mechanical tacking" action when the protruding filaments are pressed into the soft uncured tire casing. Furthermore, as discussed above, such protruding webs can also strengthen the ultimate bond between the sheeting and the tire casing.

Retroreflective sheetings of the invention typically exhibit high brightness retention when bonded to flexible substrates. For instance, sheetings of the invention may retain at least about 80 percent of their initial retroreflective brightness even after being flexed 200,000 times through cycles of elongation of 30 percent of their unstressed, i.e. relaxed, length and compression of 30 percent of their unstressed length. Thus, such articles as tire sidewalls can retain their desired retroreflective brightness. Also, due in part to the properties imparted to the resultant sheeting by reinforcing webs as described herein, retroreflective sheetings of the invention typically exhibit improved abrasion resistance as the retroreflective elements tend to be held more firmly in the support layer of sheeting, thereby tending to resist dislodgement when the sheeting is subjected to abrasive forces.

BRIEF DESCRIPTION OF DRAWING

The invention will be further explained with reference to the drawing, wherein.

These figures, which are idealized, are not to scale and are intended to be merely illustrative and nonlimiting.

DETAILED DESCRIPTION OF INVENTION

As discussed above, retroreflective sheetings of the invention comprise a monolayer of retroreflective elements partially embedded in and supported by an elastomeric support layer and protruding from the front side of the support layer, and an omni-directionally elastic high porosity reinforcing web which is at least partially embedded in the support layer, and preferably protruding from the rear side of the support layer, wherein at least the back stratum of the support layer is vulcanizable and curable. The retroreflective sheetings of the invention are omni-directionally elastic and flexible, typically over a broad temperature range.

Figure 1:
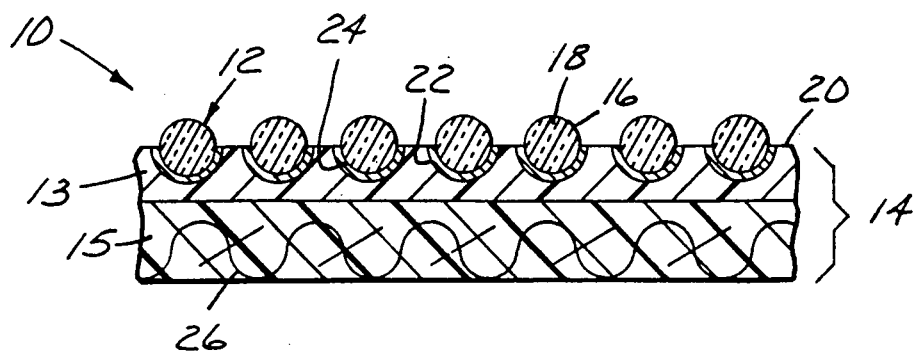
FIG. 1 is a schematic cross-section of a portion of an embodiment of the sheeting of the invention having a dual-layer support layer wherein the reinforcing web is substantially completely embedded within the support layer.

Reference is made to FIG. 1 wherein is shown portion 10 of a sheeting of the invention with retroreflective elements 12 partially embedded in binder layer 13 of support layer 14. In the embodiment shown, support layer 14 is dual-layer, comprising binder layer 13 and back layer 15, and retroreflective elements 12 comprise microspheres 16, front surfaces 18 of which protrude from front side 20 of support layer 14, with specular reflectors 22 on rear surfaces 24 of microspheres 16. Reinforcing web 26 is substantially completely embedded in support layer 14. Reinforcing web 26 preferably extends substantially throughout back layer 15, and may extend (not shown) into binder layer 13, but should not extend so closely to microspheres 16 as to weaken their bond within the binder layer such as when sheeting 10 is flexed. Front surfaces 18 of retroreflective elements 12 may be covered by an optional protective liner (not shown).

Figure 2:
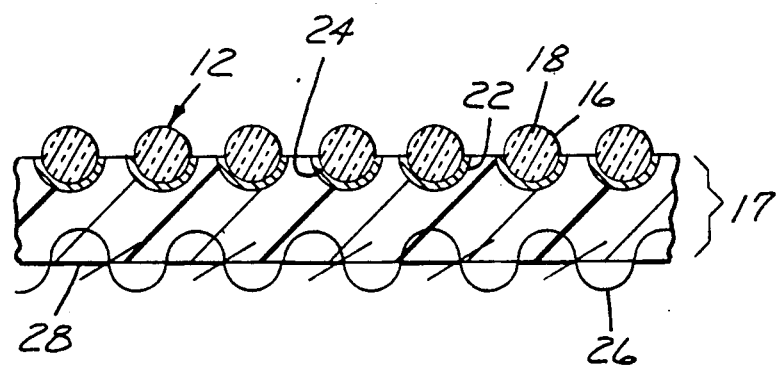
FIG. 2 is a schematic cross-section of a portion of another embodiment of the sheeting of the invention having a single-layer support layer wherein the reinforcing web protrudes from the rear side of the support layer.

FIG. 2 illustrates another embodiment wherein corresponding structural elements are annotated with the corresponding numeral used in FIG. 1. In the embodiment shown in FIG. 2, support layer 17 is a monolayer, which is vulcanizable or curable at least throughout its rearward portion, and reinforcing web 26 is partially embedded in support layer 17 and protrudes from rear side 28 thereof. The protruding portion of reinforcing web may be substantially bare, as shown or may have partial or complete coating of material, e.g., curable support layer material or other material which is compatible with the substrate, thereon (not shown) to improve the bond to the curable substrate (not shown).

The most typical kind of retroreflective elements used in sheetings of the present invention are transparent microspheres having reflective means on the rear surfaces thereof as shown in FIGS. 1 and 2. Such retroreflective elements typically provide satisfactory levels of retroreflective brightness over a wide range of incidence angles, i.e., the angles at which the light strikes the sheeting, a property sometimes referred to as "angularity". However, retroreflective elements of other configurations may be used in accordance with teachings of the present invention if desired.

When microspheres are used as retroreflective elements, the microspheres are preferably substantially spherical in shape in order to provide the most uniform and efficient retroreflection. Typically, the microspheres are preferably substantially transparent so as to minimize the amount of light absorbed by the microspheres and thereby maximize the amount of incident light which is retroreflected by sheetings of the invention. The microspheres, which are typically substantially colorless, may be colored such as with dyes or other coloring agents to produce special effects if desired.

Microspheres used in retroreflective sheetings of the invention may be made from glass or synthetic resin having the optical properties and physical characteristics taught herein. Glass microspheres are typically preferred because they typically cost less, are harder, and exhibit superior durability.

Microspheres used in the present invention typically preferably have an average diameter of between about 40 and about 200 microns, although microspheres having sizes outside this range may be used in some embodiments. Microspheres which are smaller than this range may tend to provide lower levels of retroreflection because of diffraction effects, whereas microspheres larger than this range may tend to impart undesirably rough texture to the sheeting or tend to be more readily dislodged by abrasive forces. Microspheres used in the present invention will typically preferably have a refractive index of between about 1.70 and about 2.0, more preferably between about 1.85 and about 1.91, the range typically considered to be useful in microsphere-based retroreflective products where the front surfaces of the microspheres are exposed or air-incident. However, microspheres having refractive indices outside this range may be used in accordance with the invention. For instance, microspheres having refractive indices of about 2.3 will provide retroreflection when their front surfaces have water thereon. Accordingly, for embodiments which are to be used under conditions where the front surface of the sheeting is likely to have water thereon, e.g., where the substrate is a rubber raft or flotation device, a mixture of microspheres having refractive indices of about 1.9 and about 2.3 may be used to provide dry and wet retroreflection.

As mentioned above, microsphere-based retroreflective elements of retroreflective sheetings of the invention have reflective means on the rear surfaces thereof.

Among the variety of materials which are known for this purpose are vacuum-deposited or vapor-coated metal coatings, such as aluminum or silver; chemically-deposited metal coatings, such as silver; metal-coated plastic films; metal flakes; such as aluminum or silver; and dielectric coatings. Aluminum or silver coatings are typically preferred, because they tend to provide the highest retroreflective brightness. The reflective color of silver coatings is typically preferred to that of aluminum coatings, but an aluminum vapor coat is normally more preferred overall, because silver reflective coatings typically tend to suffer more severe and more rapid degradation in outdoor exposure than do aluminum coatings. U.S. Pat. No. 3,700,305 (Bingham) discloses dielectric mirrors or coatings that may be used as reflective means in sheetings of the invention.

The support layer typically comprises a durable polymeric material which forms a flexible, elastomeric layer and preferably provides good adhesion to the other elements of the sheeting of the invention, e.g., the retroreflective elements, such as glass microspheres with aluminum coatings, and the reinforcing web. Illustrative examples of materials which are useful for use in the support layer in many applications of the invention are polytetramethylene ether diamine, e.g., having a molecular weight of about 12,000 to about 16,000; HYCAR ATBN, an amine-terminated butadiene acrylonitrile rubber available from B.F. Goodrich Co.; and bis-(3-aminopropyl) -polytetrahydrofuran, e.g., having a molecular weight of about 5,000, available from BASF. Such materials are typically used in combination with a hardening material, e.g., an epoxy resin. For instance, the illustrative materials just mentioned may be used in combination with EPON 828, an epoxy resin available from Shell Oil Company. Support layers of the invention are typically formulated in weight ratios of rubber to epoxy of between about 1:1 and about 4:1, and more typically about 2.5:1. Formulations with ratios which are lower than about 1:1 may tend to yield resultant compositions which form layers that tend to be too hard or brittle whereas rations which are higher than about 4:1 may tend to yield resultant compositions which form layers that tend to be too soft. Other examples of support layer materials which can be used in retroreflective sheetings of the invention include thermoplastic, heat-activated, ultraviolet-cured, and E-beam-cured adhesives or polymer systems.

The support layer should have flexibility, extensibility, and elasticity properties which are similar to those of the substrate to which the sheeting is to be applied, or at least sufficient to meet the stresses to which the resultant article will likely be subjected. For instance, support layers which are flexible and can return to substantially their original dimensions after being elongated about 50 percent or more will typically be suitable for use on vehicle tires. It may be preferred, however, that embodiments which are to be used on other substrates have different flexibility, extensibility, and elasticity properties in accordance with the particular substrate. Support layers which are not sufficiently flexible, extensible, or elastic to flex, stretch, or recover with the substrate under the conditions of the substrate's use may tend to tear or separate from the substrate, to weaken the substrate (e.g., due to displaced or cracked tire rubber) to develop an unsightly appearance, and/or suffer sufficient degradation to impair the desired retroreflective performance of the sheeting, e.g., by dislodgement of retroreflective elements.

As discussed above and illustrated in FIG. 1, in some embodiments of the invention, support layer 14 may be dual-layer, comprising binder layer 13 in which retroreflective elements 16 are partially embedded and back layer 15 on the rear side of binder layer 13 in which reinforcing web 26 is at least partially embedded. In such dual-layer support layers, binder layer 13 and back layer 15 should provide good adhesion therebetween, and can be separately formulated to optimize different properties. For instance, binder layer 13 can be formulated to optimize its color and adhesion to retroreflective elements 16, and back layer 15 can be formulated to optimize its adhesion to web 26, and compatibility with the substrate elastomer.

Commercially available materials which are believed to be suitable for use in the back layer of dual layer support layers of sheetings of the invention include A1638 Natural Rubber Adhesive, from B.F. Goodrich Co., UNIROYAL 6287 N.R. Rubber Adhesive, from Uniroyal Tire Company, and CHEMLOCK 252, from Hughes Lord Corporation.

The support layer may further comprise a whitening agent such as a pigment, e.g., titanium dioxide, or dye to increase the overall whiteness of the article. Alternatively, it may comprise a coloring agent or combinations of agents selected to impart a different color thereto, e.g., pigments or dyes which impart yellow, orange, red or other color. In the case of embodiments of the invention having dual-layer support layers, such agents are typically used in the binder layer which is usually visible whereas the backing layer often tends to be hidden from view and, accordingly, may be substantially free of coloring agent.

Additionally, the support layer may typically also comprise one or more weathering agents, stabilizers, ultraviolet absorbers, antioxidants, energy quenchers, reinforcing agents, processing aids (e.g., lubricants, peptizers), hardening agents, adhesion promoters, activators, vulcanizers, plasticizers, accelerators, etc. in view of the properties desired for the ultimate application for which the sheeting is being prepared and conditions to which it will likely be subjected. In the case of embodiments of the invention having multi-layer support layers, such components may be used in one or more of the individual layers therein.

Support layers of sheetings of the invention may be multi-layer, i.e., comprise two or more layers. In addition to the aforedescribed back layer and binder layer, there may be a prime layer therebetween or other layer which imparts a desired property to the sheeting.

Retroreflective sheetings of the invention comprise a flexible reinforcing web which is omni-directionally elastic and which is at least partially embedded in the support layer and preferably protrudes from the rear side therefrom. As previously defined, by "omni-directionally elastic" it is meant that the web tends to return to substantially its original dimensions after release of a tensile force elongating same in substantially every direction or orientation instead of only along specific directions or orientations. Omni-directionally elastic, as used herein, does not mean that the elasticity of the reinforcing web is equal in all directions, but does mean that the web may be extended in any direction, preferably at least about 40 percent, and will tend to recover from same. Such webs impart greater strength to the retroreflective sheeting, improve the handling characteristics of the sheeting by increasing the strength and maintaining the elasticity thereof, and may strengthen the bond between the sheeting and the substrate. Because of the strength imparted to the overall sheeting by omni-directionally elastic reinforcing webs as taught herein, the thickness of the support layer of retroreflective sheetings adapted to be bonded to vulcanizable or curable substrates may be reduced, thereby permitting cost savings.

Illustrative examples of reinforcing webs used in the present invention are knit webs (illustrative examples are double knits and circular knits), nonwoven webs (illustrative examples are thermally-bonded, chemically-bonded, spun-bonded, and point-bonded webs) and some woven webs. I have discovered that such webs tend to provide higher and more uniform extensibility and elastic properties in all directions as compared to woven webs which tend to be bi-directional rather than omni-directional. Knit webs tend to recover more fully substantially without wrinkling after being elongated than do nonwoven webs. However, although some nonwoven webs may tend to wrinkle slightly after repeated elongation and relaxation, nonwoven webs have been found to be more resistant to "necking down", i.e., curling along an axis parallel to the direction of elongation, when elongated, particularly in strip form, and may, because they thus tend to retain a more planar profile, be easier to use for some applications. Urethane-based nonwoven webs, have been observed to substantially resist wrinkling when repeatedly elongated and released, but tend to provide insufficient strength. It is believed, however, that a urethane-based nonwoven web which would impart greater strength to the sheeting as well as possess the other properties discussed herein could be used in a sheeting of the present invention.

Woven webs have not been observed to generally exhibit the desired omni-directional elasticity, i.e., they are typically elastic only along the bias. However, a woven web that has the desired omni-directional extensibility properties described herein could be used in the present invention. For instance, a web woven from spandex filaments would be expected to provide desired omni-directional elasticity, and accordingly could be used herein.

Reinforcing webs used in sheetings of the invention preferably have high porosity such that the support layer material and, in embodiments where the web protrudes from the support layer, the substrate elastomer material, flow completely around the filaments of the web such that there are substantially no voids in the finished article, thereby optimizing the adhesion of the reinforcing web to such materials and strengthening the resultant article. Accordingly, it is typically preferred that reinforcing webs used in accordance with the present invention have a weight per square yard of between about 0.3 ounce and about 2.0 ounces.

Reinforcing webs used in sheetings of the invention typically preferably have a grab tensile (breaking) strength in all directions of at least about 9 pounds/inch-width (15 Newtons/centimeter-width). The resultant sheeting typically should have a breaking tensile strength of at least about 15 pounds/inch-width (26 Newtons/centimeter-width) to be conveniently convertible, e.g., slit from bulk sheet form to desired size.

Typically, reinforcing webs used herein preferably have an elongation in all directions of at least about about 40, and more preferably at least about 120 percent, depending in part upon the application for which the resultant sheeting is to be used. For instance, on a rubber substrate such as a tire, an elongation in all directions for the resultant sheeting of at least about 40, more preferably 50, percent or more is typically sufficient to prevent cracking.

It is also typically desirable that the thickness of the sheeting of the invention be made thin so as to reduce the thickness of the portion of the substrate (e.g., tire sidewall) which is displaced by the sheeting. Accordingly, it is typically desirable that the individual component layers of the sheeting be thin. Thus, reinforcing webs for use in sheetings of the invention are typically preferably between about 0.002 inch and about 0.01 inch (50 and 250 microns) in thickness. It will be understood, however, that depending in part upon the application for which the resultant sheeting is to be used, reinforcing webs having thicknesses outside this range may be used in some embodiments of the invention.

Polyesters, polypropylenes, polyethylenes, nylons, polyamides, celluloses, acetates, fiberglasses, or blends thereof, are illustrative examples of some materials from which webs useful as reinforcing webs in accordance with the present invention may be made. Nylon reinforcing webs are typically preferred because they tend to exhibit higher strength and to bond more strongly to the binder material than do polyester or polyproylene reinforcing webs. Some commercially available fabrics which are suitable as reinforcing webs of retroreflective sheetings of the invention include knits such as Type N35, a 15 denier 1.0 ounce/yard$^2$ nylon fabric from Apex Mills; Type LF2, a 40 denier 1.8 ounce/yard$^2$ polyester fabric also from Apex Mills; and Type 6119, a 20 denier 0.9 ounce/yard$^2$ polyester fabric from L. Travis Textiles; nonwovens such as LUTRABOND 3020, 3135, and 4140, respectively 0.6, 1.0, and 1.2 ounces/yard, polyamide-6 fabrics from Lutravil Company; spun-bonded fabrics such as CEREX Spunbonded Nylon Type 23 Series, a nylon-6,6 fabric in weights of, e.g., 0.3, 0.5, 0.6, and 0.7 ounce/yard2 from James River Commpany, and PBN-II, Point-Bonded Nylon Type T30 from James River Company.

One manner of making a retroreflective sheeting of the present invention is as follows. Microspheres of the appropriate size and refractive index are cascaded onto a polyethylene-coated carrier, typically precoated with a low adhesion sizing to ensure desired release of the microspheres therefrom, and then partially embedded therein by heating. The microspheres are preferably packed in their closest hexagonal packing arrangement so as to maximize the retroreflective brightness of the resultant sheeting. Reflective means, such as an aluminum vapor coat, is then applied to the exposed portions of the microspheres.

The binder layer is then applied over the protruding microspheres, may optionally be partially cured, e.g., to secure the microspheres in desired orientation, and then the backing layer is then applied over the binder layer. The backing layer may then be partially cured in some instances. The reinforcing web is then applied. The web is typically sunk partially into the backing layer, or even partially into the binder layer, and/or additional amounts of the backing layer material may be applied thereto such that the reinforcing web is at least partially embedded in the support layer. In embodiments where the web protrudes from the rear of the support layer, the filaments of the protruding web are typically coated with a thin amount of elastomer to increase the adhesion of the protruding portion of the web to the substrate upon fabrication of the article.

In the case of dual-layer support layers, typically the strongest bond between the binder layer and backing layer is achieved if they are cured at least in part while in contact with one another. Partially curing of the support layer is typically also useful to control the depth to which the reinforcing web becomes embedded in the support layer and to prevent the reinforcing web from sinking too close to, or even into contact with, the retroreflective elements. At least the back stratum of the support layer, e.g., the backing layer or the portion thereof which comprises the rear side of the support layer, preferably remains in an at least partially uncured state such that when the sheeting is applied to a curable substrate, a strong bond thereto may be obtained. The retroreflective sheeting may be stripped away from the carrier to expose the front surfaces of the microspheres either before or after the sheeting is applied to a desired substrate.

The binder layer and backing layer, or in the case of a single-layer support layer, the single layer thereof, may be applied in a single coat or in one or more successive coats by known techniques, e.g., extrusion, knife-coating, spraying, etc. For instance, in the case of a single-layer support layer, a first coat may be applied over the retroreflective elements and partially cured to ensure proper spacing of the subsequently-applied reinforcing web from the retroreflective elements followed by application of one or more subsequent coats of the support layer material. I have found that typically optimum support and retention of the retroreflective elements by the support layer is achieved when the elements are essentially entirely supported by the support layer and separated from the embedded portion of the reinforcing web by at least a distance equal to one or two times the average size of the retroreflective elements.

To bond a sheeting of the present invention to a rubber article such as a tire, a piece of the sheeting is cut to appropriate dimension and is placed on the proper location of the unvulcanized or green tire casing, with the rear side of the support layer in contact with the tire casing. When using embodiments where the reinforcing web protrudes from the rear side of the support layer, it may be preferred to apply moderate pressure such as with a hand roller to the sheeting so as to slightly embed the protruding filaments into the tire casing, thereby tacking the sheeting into desired position. This enables better control over positioning of the retroreflective sheeting on the substrate as the substrate is shaped into various mold configurations. This assembly is then put into the tire mold for vulcanization. Alternatively, a piece of the sheeting of appropriate dimension may be placed in the mold in the proper location prior to inserting the green tire casing. In such instances, it may be desired to provide means in the mold, e.g., alignment grooves, for securing the sheeting in proper location with respect to the tire.

When heat and pressure are applied, the tire casing is shaped and cured and the sheeting is bonded to, typically partially embedded in, the surface thereof. The vulcanizable portion of the support layer vulcanizes with the elastomer of the tire sidewall such that the sheeting forms a substantially integral part of the tire sidewall. In those embodiments where it initially protrudes from the rear side of the support layer, the reinforcing web typically tends to reinforce the bond between the sheeting and the tire side wall.

Figure 3:
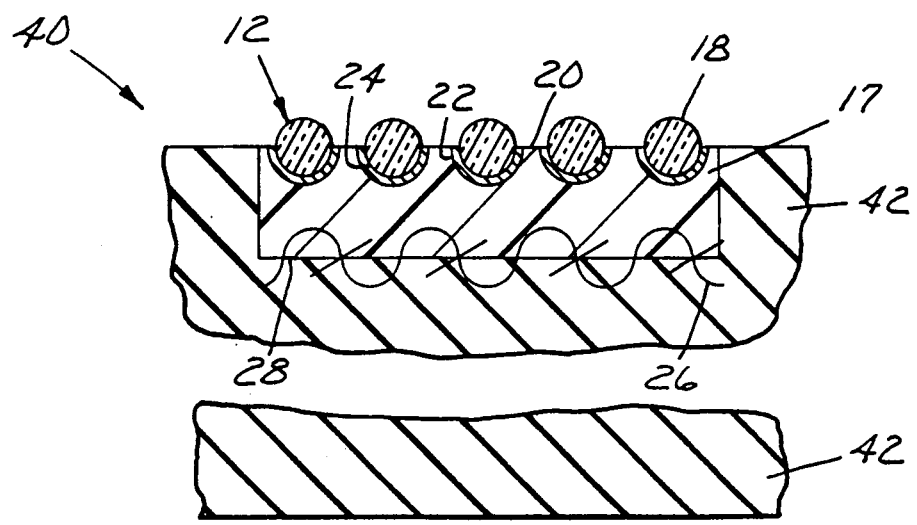
FIG. 3 is a schematic cross-section of a portion of a rubber article to which a sheeting of the invention has been bonded in accordance with the invention.

FIG. 3 illustrates portion 40 of a finished rubber article such as a tire to which sheeting 10 has been bonded. As shown in the Figure, sheeting 10 is bonded to body 42 of the tire by reinforcing web 26 which protruded out of rear side 28 of backing layer 15 of sheeting 10 into body 42. Following vulcanization, support layer 14 and body 42 are strongly bonded together, and web 26 reinforces such bond.

Retroreflective sheetings of the present invention may be bonded to a variety of rubber articles, including for example, tire sidewalls, footwear, clothing such as raincoats, watercraft such as boats or rafts, flotation devices, etc.

EXAMPLES

The invention will be further explained by the following illustrative examples which are intended to be nonlimiting. Unless otherwise indicated, all amounts are expressed in parts by weight.

Except as otherwise indicated, the following test procedures were used to evaluate the microsphere-based retroreflective articles discussed in the Examples.

Retroreflective Brightness

Retroreflective brightness was measured using a retroluminometer as described in U.S. defensive publication T987,003 at the indicated divergence angles of about 0.2° and at entrance angles of about −4°.

Adhesion

To test adhesion, 3/16 inch (0.5 centimeter) wide strips of the retroreflective sheetings being tested were vulcanized to a rubber substrate, and then scored with a razor blade and a peel force applied by hand to remove or delaminate the strip from the substrate. The observed adhesion results are rated as follows:

| Rating | Result |
| --- | --- |
| Excellent | Rubber tears, substantial removal of rubber with sheeting strip, strip cannot be removed continuously. |
| Very Good | Rubber tears, some rubber removed with strip, strip removed in pieces up to 1 inch in length. |
| Good | Small amounts of rubber removed with strip, continuous removal of strip in one piece with force. |
| Fair | Substantially no rubber on strip, continuous removal of strip in one piece with moderate force. |
| Poor | Continuous removal of strip with light force. |

Breaking Force

Breaking Force was determined by placing a 3/16 inch (0.5 centimeter) wide strip of the retroreflective sheeting being tested in an Instron 1122 at an initial jaw separation of 2 inches (5 centimeters) and then stretching at a cross head speed of 10 inches/minute (25 centimeters/minute) while measuring the force.

Elongation

Elongation was determined as the percentage elongation at the point of break when determining Breaking Force.

Thickness

Thickness was measured with a hand-held spring caliper

Flex Resistance

Flex Resistance was determined as percentage of Retroreflective brightness Retained by 3/16 inch (0.5 centimeter) wide samples of retroreflective sheeting bonded to rectangular rubber substrates whereupon the rubber substrates were flexed 204,400 times through a cycle of elongation and compression. The rubber substrates were secured between two jaws of a Getty Flex Tester at a separation of 5 inches (13 centimeters). Each cycle comprised elongation to 6.5 inches (17 centimeters) separation and compression of 3.5 inches (8.9 centimeters) separation. Samples were evaluated vertically (single retroreflective strip parallel to rectangular rubber strip and axis of elongation/compression) and horizontally (retroreflective strip perpendicular to rectangular rubber sample and axis of elongation/compression).

EXAMPLES 1-5 AND COMPARATIVE EXAMPLES A-B

A polyethylene-coated paper (available from Schoeller Paper Co.) was prepared by applying, and allowing to dry, a solution of a urethane and a fluorochemical compound in toluol, to the coated side. This sizing treatment provides for easier release of the microspheres from the carrier. Glass microspheres having refractive indexes of about 1.9 and average diameters of 50 to 75 microns were cascaded onto the treated side of the polyethylene-coated paper to form a closely packed monolayer thereon, and the arrangement then heated so as to sink the microspheres partially into the coating to a depth sufficient to provide a resultant, i.e., after vapor coating, half brightness angle of between about 52° and 58°. Following cooling of the arrangement, an aluminum vapor coat of at least 900 angstroms thickness was applied to the exposed portions of the microspheres.

| Amount | Component |
|---|---|
| 25.66 | Polytetramethylene ether diamine having a molecular weight of 12,000–16,000, backbone polymer. |
| 12.37 | Titanium dioxide, white colorant. |
| 0.65 | DMP30 - 2,4,6-tri(dimethylaminomethyl)phenol available from Rohm and Haas, hardening agent. |
| 35.66 | Toluol, solvent. |
| 11.15 | Xylol, solvent. |
| 12.74 | EPON 828 - diglycidyl ether of Bisphenol A, available from Shell Oil Co., epoxy resin. |
| 0.91 | Bisphenol adduct of methylene bis(4-phenylisocyanate), a phenol-blocked isocyanate accelerator |
| 0.87 | Z-6020 - N-beta-amino-gamma-amino-propyltrimethoxysilane available from Dow Chemical Co., adhesion promoter. | was prepared, and then coated over the aluminum-coated microspheres at about 10 mils (250 microns) wet thickness. This construction was partially cured at about 200° F. (95° C.) for about 3 minutes.

A back layer was then formed on the back side of the binder layer by coating, to about 10 mils (250 microns) wet thickness, the following composition:

| Amount | Component |
|---|---|
| 47.5 | SMRCV60 - standard Malaysian natural rubber, from Goodyear Rubber Co. |
| 15.8 | NEOPRENE W - polychloroprene rubber, from du Pont, synthetic rubber. |
| 0.32 | PEPTON 44 - activated dithio-bisbenzanilide on an inert carrier, from American Cyanamid Co., peptizer. |
| 0.63 | Stearic Acid, from Hum Ko Corp., lubricant. |
| 0.63 | ETHANOX 330 - 1,3,5-trimethyl-2,4,6-tris(3,5-di-tert-butyl-4-hydroxybenzyl) benzene, from Ethyl Corp., antioxidant. |
| 0.63 | MAGLITE D - magnesium oxide, from Calgon Corp., activator for neoprene. |
| 12.7 | N-550 FEF BLACK - carbon black, from Cabot Corp., reinforcing agent. |
| 12.7 | HISIL 233 - precipitated hydrated amorphous silica, from Pittsburgh Plate Glass Ind., reinforcing agent. |
| 3.2 | CIRCOLITE RPO - chemically neutralized heavy napthenic distillate, from Sun Refining and Marketing Co., plasticizer. |
| 3.2 | Zinc Oxide, from New Jersey Zinc Co., activator for natural rubber. |
| 1.6 | CRYSTEX 950T20 - compounded polymeric sulfur, sulfur, and napthenic oils, from Stauffer Chemical Co., vulcanizer. |
| 0.48 | SANTOCURE - n-cyclohexyl-2-benzothiazole-sulfonamide, from Monsanto Co., accelerator. |
| 0.66 | AGERITE D - polymerized 2,2,4-trimethyl-1,2-dihydroquinoline, from R. T. Vanderbilt Co., antioxidant. |

A piece of the indicated reinforcing web was then placed on the wet composition and the construction then dried at about 200° F. (95° C.) for about 6 minutes, and then partially cured at about 150° F. (65° C.) for about 2 hours.

The resultant sheets then were cut into strips about 3/16 inch (0.5 centimeter) in width.

The rubber composition was as follows:

| Amount | Component |
|---|---|
| 26.5 | SMRCV60 |
| 9.1 | SBR 1778 - oil extended styrene butadiene, from Copolymer Rubber and Chemical Co., synthetic rubber. |
| 11.0 | EPSYN 55 - ethylene propylene terpolymer, from Copolymer Rubber and Chemical Co., synthetic rubber. |
| 0.88 | ETHANOX 330 |
| 22.1 | N-550 FEF BLACK |
| 6.4 | CIRCOLITE RPO. |
| 22.1 | Zinc Oxide |
| 0.44 | Stearic Acid |
| 11.1 | CRYSTEX 950T20 |
| 0.44 | SANTOCURE |

This composition vulcanizes when heated to about 355° F. (180° C.) for about five minutes.

The retroreflective strips were laid upon samples of the rubber compound, web side down, and pressed with a hand roller to embed the protruding web into the rubber compound. The samples were then placed into a metal mold for hot press vulcanization under about 200 pounds/inch$^2$ (1.4×10$^3$kPa) for about five minutes at about 355° F. (180° C.), and then cooled to room temperature in a water bath.

The following reinforcing webs were used:

| Example | Web |
|---|---|
| 1 | Apex Mills N35-knit, 1 ounce/yard² 15 denier nylon. |
| 2 | Apex Mills LF2-knit, 1.8 ounce/yard², 40 denier polyester. |
| 3 | L. Travis Textiles 6119-knit, 0.9 ounce/yard², 20 denier polyester. |
| 4 | Lutravil 3135-nonwoven, 1.0 ounce/yard² polyamide-6. |
| 5 | James River T-23-nonwoven, 0.5 ounce/yard² nylon-6,6. |

Comparative Example A was SCOTCHLITE Brand 8150 Reflective Tire Sheeting from 3M, which comprises a monolayer of aluminum vapor coated microspheres partially embedded in a binder layer of bead bond about 165 microns thick with properties similar to those of the sheetings in Examples 1–5, with about a 13 micron thick layer of a heat-activated adhesive on the back side thereof.

Comparative Example B was MICROLITE Brand TM66 Rubber High Intensity Reflective Sheeting from Microlite Industrial Co., Ltd., which is believed to comprise a monolayer of vapor coated microspheres partially embedded in a binder layer of bead bond about 75 microns thick with, on the back side thereof, a bias-cut woven fabric coated with a resinous material.

The properties of these sheetings were as follows:

TABLE I

| Example | Thickness (Microns) | Elongation Force[1] (Newtons) | | | | | | Elong/Break Force[1] (%/Newtons) | | Flex Resist. (% Bright. Retention) | | Adhesion |
|---|---|---|---|---|---|---|---|---|---|---|---|---|
| | | @ 10% | | @ 20% | | @ 30% | | | | | | |
| | | X[2] | Y[2] | X | Y | X | Y | X | Y | H[3] | V[4] | |
| 1 | 265 | 3.6 | 3.5 | 5.7 | 5.4 | 7.4 | 6.4 | 67/15 | 116/24 | 85 | 92 | Good |
| 2 | 307 | 7.2 | 4.0 | 13 | 6.2 | 17 | 8.3 | 57/25 | 99/26 | 86 | 93 | Very Good |
| 3 | 260 | 6.4 | 3.8 | 9.6 | 5.3 | 11 | 6.2 | 69/20 | 131/20 | 83 | 85 | Good |
| 4 | 256 | 3.9 | 3.0 | 6.0 | 4.6 | 7.3 | 5.7 | 74/12 | 86/10 | 82 | 90 | Good |
| 5 | 166 | 5.3 | 3.4 | 7.8 | 4.9 | 9.3 | 5.7 | 58/12 | 53/6.8 | 82 | 84 | Excellent |
| A | 208 | 5.0 | — | 6.5 | — | 7.7 | — | 178/23 | 175/23 | 82 | 83 | Excellent |
| B | 243 | 6.4 | — | 15 | — | 31 | — | 43/50 | — | 19 | 54 | Good |
| Tire Black Wall | 2013 | 4.4 | 4.2 | 8.2 | 8.3 | 12 | 15 | 139/38 | 54/32 | NA[5] | NA | NA |
| Tire Gum Wall | 2022 | 5.7 | 4.9 | 10 | 9.7 | 15 | 13 | 101/38 | 47/37 | NA | NA | NA |

[1] 3/16 inch (4.8 millimeter) width.
[2] X axis represents machine direction and would be substantially in the same direction as the circumference of a tire. Y axis represents cross direction and would be substantially perpendicular to the circumference of a tire.
[3] H represents horizontal mount, i.e., retroreflective strip mounted on rubber sample perpendicularly to axis of flex.
[4] V represents vertical mount, i.e., retroreflective strip mounted on rubber sample parallel to axis of flex.
[5] Not Applicable Various modifications and alterations of this invention will become apparent to those skilled in the art without departing from the scope and spirit of this invention.

What is claimed is:

1. A retroreflective sheeting comprising a monolayer of retroreflective elements partially embedded in an elastomeric support layer and protruding from the front side of said support layer, and an omni-directionally elastic filamentary reinforcing web at least partially embedded in the rear portion of said support layer, wherein at least the back stratum of said support layer is a vulcanizable or curable elastomer which forms a strong bond to rubber when simultaneously cured with rubber.

2. The sheeting of claim 1 wherein said reinforcing web is selected from the following: knit webs, nonwoven webs, and woven webs.

3. The sheeting of claim 1 wherein said reinforcing web comprises at least one of the following: urethane, polyester, polypropylene, polyethylene, nylon, polyamide, cellulose, acetate, and fiberglass.

4. The sheeting of claim 1 wherein said reinforcing web protrudes from the rear side of said support layer.

5. The sheeting of claim 1 wherein said reinforcing web has sufficient porosity to permit uncured elastomer to flow therethrough during vulcanization.

6. The sheeting of claim 1 wherein said reinforcing web has an elongation in all directions of at least about 40 percent.

7. The sheeting of claim 1 wherein said reinforcing web has a grab tensile strength in all directions of at least about 9 pounds/inch-width.

8. The sheeting of claim 1 wherein said reinforcing web has a weight of between about 0.3 and about 2.0 ounces/yard².

9. The sheeting of claim 1 wherein said sheeting has a break force in all directions of at least 2.5 pounds per 3/16 inch-width.

10. The sheeting of claim 1 wherein said support layer is monolayer.

11. The sheeting of claim 1 wherein said support layer is dual-layer and comprises a binder layer in which said microspheres are partially embedded in, and a back layer in which said reinforcing web is at least partially embedded in.

12. The sheeting of claim 1 wherein said support layer is multi-layer.

13. The sheeting of claim 1 wherein said support layer comprises at least one of the following: whitening agent, coloring agent, weathering agent, stabilizer, ultraviolet absorber, antioxidant, energy quencher, reinforcing agent, processing aid, hardening agent, adhesion promoter, activator, vulcanizer, accelerator, and plasticizer.

14. The sheeting of claim 1 wherein said sheeting has an elongation in all directions of at least 40 percent.

15. The sheeting of claim 1 wherein said support layer is about 2 mils thick.

16. The sheeting of claim 1 wherein said reinforcing web has an elongation in all directions of at least about 40 percent, a grab tensile strength in all directions of at least about 9 pounds/inch-width, and a weight of between about 0.3 and about 2.0 ounces/yard², and said sheeting has a break force in all directions of at least about 2.5 pounds per 3/16 inch-width.

17. The sheeting of claim 1 wherein said sheeting has an elongation in all directions of at least about 40 percent and a break force in all directions of at least about 2.5 pounds per 3/16 inch-width.

18. The sheeting of claim 1 wherein said retroreflective elements comprise substantially transparent microspheres, the front surfaces of which protrude from the front side of said support layer, said microspheres having reflective means on the rear surfaces thereof.

19. The sheeting of claim 18 wherein said reflective means comprise are least one of the following: metal coatings, metal flakes, or dielectric coating.

20. A sheeting of claim 1 bonded to a rubber article wherein said block back stratum of said support layer is vulcanized.

21. A sheeting of claim 1 bonded to the sidewall of a tire wherein said back stratum of said support layer is vulcanized.

22. The sheeting of claim 21 wherein said reinforcing web is partially embedded within said support layer and partially within the body of said tire such that it reinforces the bond between said support layer and said tire.

23. The sheeting of claim 1 wherein said sheeting retains at least about 80 percent of its initial retroflective brightness after being flexed 200,000 times through cycles of elongation of 30 percent of its unstressed length and compression of 30 percent of its unstressed length.

* * * * *

UNITED STATES PATENT AND TRADEMARK OFFICE
CERTIFICATE OF CORRECTION

PATENT NO. : 5,055,347
DATED : October 8, 1991
INVENTOR(S) : Chester A. Bacon, Jr.

It is certified that error appears in the above-identified patent and that said Letters Patent is hereby corrected as shown below:

On the title page, under "References Cited", the following should be listed under U.S. Patent Documents:

--3,946,782   3/1976   Petrasek et al. ............ 152/209R--
--4,767,481   8/1988   Bryant et al. ............. 156/116--

In Column 8, Line 35, "yard" should read --$yard^2$--.

In Column 11, Line 44, before the table, insert
    --A binder resin comprising:--

Signed and Sealed this

Sixth Day of April, 1993

*Attest:*

STEPHEN G. KUNIN

*Attesting Officer*   Acting Commissioner of Patents and Trademarks